METHOD OF MAKING RESISTS TO BE USED IN ETCHING ROTOGRAVURE CYLINDERS FOR FOUR-COLOR PRINTING

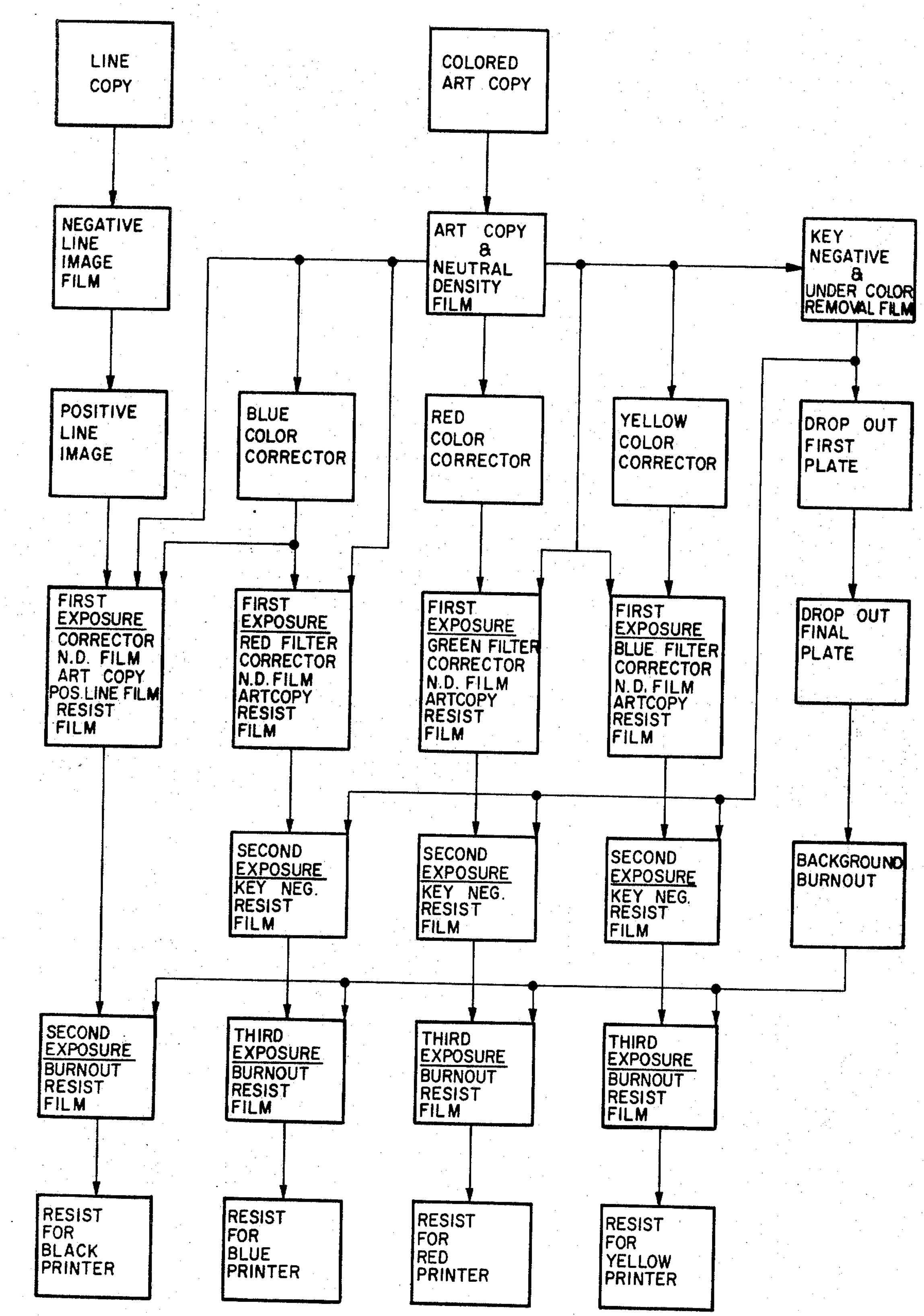
LINE COPY
COLORED ART COPY
NEGATIVE LINE IMAGE FILM
ART COPY & NEUTRAL DENSITY FILM
KEY NEGATIVE & UNDER COLOR REMOVAL FILM
POSITIVE LINE IMAGE
BLUE COLOR CORRECTOR
RED COLOR CORRECTOR
YELLOW COLOR CORRECTOR
DROP OUT FIRST PLATE
FIRST EXPOSURE CORRECTOR N.D. FILM ART COPY POS.LINE FILM RESIST FILM
FIRST EXPOSURE RED FILTER CORRECTOR N.D.FILM ARTCOPY RESIST FILM
FIRST EXPOSURE GREEN FILTER CORRECTOR N.D. FILM ARTCOPY RESIST FILM
FIRST EXPOSURE BLUE FILTER CORRECTOR N.D. FILM ARTCOPY RESIST FILM
DROP OUT FINAL PLATE
SECOND EXPOSURE KEY NEG. RESIST FILM
SECOND EXPOSURE KEY NEG. RESIST FILM
SECOND EXPOSURE KEY NEG. RESIST FILM
BACKGROUND BURNOUT
SECOND EXPOSURE BURNOUT RESIST FILM
THIRD EXPOSURE BURNOUT RESIST FILM
THIRD EXPOSURE BURNOUT RESIST FILM
THIRD EXPOSURE BURNOUT RESIST FILM
RESIST FOR BLACK PRINTER
RESIST FOR BLUE PRINTER
RESIST FOR RED PRINTER
RESIST FOR YELLOW PRINTER 3,740,222

Andrew David McGlashan, Sr., Warsaw, Ind., assignor to R. R. Donnelley & Sons Company Continuation of abandoned application Ser. No. 726,843, May 6, 1968. This application Mar. 23, 1971, Ser. No. 127,308
Int. Cl. G03c 5/06
U.S. Cl. 96—30 7 Claims

ABSTRACT OF THE DISCLOSURE

This invention provides a method for making corrected color separations directly onto a light sensitive silver halide gravure resist film which after exposure and development is used in etching rotogravure cylinders. Undercolor removal and background burnout is also carried out directly on the resist film by multiple exposure to before it is developed, and the fully color-corrected continuous tone positive conventionally used in preparing gravure resist films is entirely eliminated.

CROSS-REFERENCE TO RELATED APPLICATION

This is a continuation of my copending application Ser. No. 726,843, filed May 6, 1968, and now abandoned, for Method of Making Resists to be Used in Etching Rotogravure Cylinders for Four-Color Printing.

SPECIFICATION

This invention relates to a method of making corrected color separations in the preparation of resists for use in etching rotogravure cylinders for four-color printing.

The conventional method of making color separations for the above indicated use involves exposure of the original art work through appropriate filters onto panchromatic photographic film to make negatives from which positives are produced. Resist forming film is then exposed through these positives. Thus, the conventional method includes basically three sequential exposures on as many photosensitive films. Color separation and correction, undercolor removal and retouching are performed prior to the exposure of the last photosensitive film which will form the resist.

According to the present invention, color separations are made directly onto a light sensitive silver halide gravure resist film by three exposures of each resist film, which after development is used in etching rotogravure cylinders. The preliminary steps of making panchromatic negatives and positives for each of the four resists is entirely eliminated.

Light sensitive silver halide gravure resist films are well known in the art. Such films are referred to, and described, for instance, in U.S. Pats. 2,628,903, 2,907,657, 2,997,392, 3,057,722, 3,148,063, 3,179,519, 3,310,403, 3,321,311 and 3,375111. Commercially such films are sold by E. I. du Pont de Nemours and Co. under the trademark "Rotofilm" and by Gavaert Photo-Producten N.V. under the trademark "Rotargo." Eastman and Chemco have comparable resist films under other trademarks. The commercially available products are orthochromatic, but panchromatic films can be made.

The single drawing forming part of this application is a flow chart of the method of the present invention as applied to the reproduction of transparent art work.

As shown in the drawing, the starting material is usually black and white line copy (textual matter) and four-color art work. For inclusion with the black printer, the line copy is converted by photographic exposure (camera or contact) of silver halide film into a negative line image which in turn is converted into an appropriate positive line image, by methods well known in the art.

The art copy, which may be either transparent or reflective, consists usually of a number of individual pieces which are placed in windows in a transparent film in properly imposed position. The highlight areas of each piece of art work are evaluated for control purposes and an appropriate neutral density film is mounted in front of each piece of art work. The neutral density film is a film of such uniform predetermined optical density (gray) as to make all white areas of all the pieces of art work balanced or of the same density. The provision of such neutral density film is a conventional procedure.

From the art copy combined with neutral density film a key negative (which may also be designated as an image film) is prepared by exposure with white light of panchromatic silver halide film. The resulting key negative is used for undercolor removal (as disclosed hereinbelow) and also to prepare, by exposure of photographic film, a positive dropout first plate. The white and gray areas of the latter are opaqued and the plate is then used to make a negative dropout final plate. The latter serves to make a positive background burnout film which is opaqued to eliminate pin spots in dark areas and is then applied as disclosed hereinbelow for effecting a completely white background in the printed product.

From the art copy with the neutral density film blue, red and yellow color corrector films are prepared by known methods. The Eastman Kodak camera back masking technique is preferred. Appropriate known steps are used to make the images in the color corrector films diffuse rather than sharp, as by exposing a color transparency with its rear side contacting the film.

The resist film may be prescreened. However, if desired, the resist film may be screened subsequently to the exposures described hereinbelow.

As so far described, the process of the present invention employs conventional steps. The next following steps (preparation of resists for making the black, blue, red and yellow printers) are new.

The resist for the black printer is prepared by two exposures of light sensitive silver halide gravure resist film. In the first exposure, the resist film is exposed through the blue color corector film, the art copy with the neutral density film and the positive line image film. The art copy and the line image film, of course, are in properly imposed relationship. In the second exposure, the resist film is exposed through the background burnout film. These two exposures are both done with white light.

The resists for the blue, red and yellow printers are each prepared by similar multiple exposures of resist film. In the first exposure, the resist film is exposed through a filter (red, green or blue), a color corrector film (blue, red or yellow) and, if the art copy is transparent, through the art copy with the neutral density film. When reflective art copy is used the resist film is exposed to it through the filter, the color corrector, and the neutral density film. This puts a basic color corrected latent image of the art copy on the resist film. In the second exposure, the resist film is exposed through the key negative film, to modify the latent image, for undercolor removal. This second exposure may be omitted when no undercolor removal is needed or desired. For the third exposure, the resist film is exposed through the background burnout film to further modify the latent image.

After the resist film has been exposed as disclosed, the film is developed and is then ready for use as a resist in etching gravure cylinders for four-color printing. This development renders the more heavily exposed film areas more resistant to penetration by etching fluid. Thus, the developed resist may be considered to be a negative image of the original copy which then produces a positive printing image on the gravure cylinder.

When panchromatic resist film is used, the above exposures may be carried out in conventional fashion Further, enlargement or reduction in size may be done. However, when orthochromatic resist film is used (Rotofilm or Rotargo or equivalent), novel and unexpected steps are required. It has always been believed in the art that orthochromatic silver halide film is wholly insensitive to red light. I have found that this is untrue, and that the exposure through the red filter (for preparing the resist for the blue printer) of orthochromatic resist film can be successfully done if the exposure is carried out with an amount of light energy about 750 to 1250, say about 1000, times that required for the other exposures, as by contact exposure in a vacuum frame of transparent (but not of reflective) copy to a 2000 watt pulsed Xenon light at 6 feet from the frame for 2½ minutes or to an equivalent exposure. The resulting exposed resist film is a faithful reproduction, without loss of detail and without distortion or disproportionation as between highlight, middle tone and shadow areas, of the spectral portion of the art copy to be reproduced by the blue printer.

As disclosed, the present invention comprises providing art copy with appropriate neutral density film attached thereto, color corrector films, a key negative film, a background burnout film, and a positive line film. The black and white, and the colored resist printer films are multiply exposed to the art copy through the appropriate films and filters. This procedure offers many advantages over the conventional method of making rotogravure resists by a single exposure through a previously corrected continuous tone positive.

There are fewer exposures so that the elapsed time in making resists is greatly reduced. Film consumption is minimized. There is no need for making highlight films. Loss of detail is held to minimum, since the art work is reproduced directly onto the resist film rather than being transferred through two additional intermediate film stages, and there is no need to correct for color aberration due to the two intermediate films.

Many details may be varied without departing from the principles of this invention which are set forth in the appended claims.

I claim:

1. A multiple exposure method of making a resist directly from art copy for etching one of the color cylinders used in four-color gravure printing, said method comprising:
- providing four-color art copy;
- providing a photographic filter of the color required for said one of said color cylinders;
- providing a color corrector film of the color required for said one of said color cylinders;
- providing a silver halide gravure resist film;
- making a first modifying transparency consisting of a key negative film prepared from said art copy;
- making a second modifying transparency consisting of a background burnout film prepared from said art copy;
- making a photographic exposure of said gravure resist film to said art copy through said filter and said color corrector film to provide a color corrected latent image of the art copy on the resist film for said one of said cylinders;
- selectively further exposing said resist film through at least one of said modifying transparencies to modify said latent image in predetermined respects;
- and developing said resist film.

2. The method of claim 1 in which the step of selectively further exposing said resist film includes exposing said film a first time through the key negative film for undercolor removal and a second time through the background burnout film.

3. The method of claim 1 in which the gravure resist film is orthochromatic and is used to make a resist for etching a blue cylinder, the photographic filter is red, and the exposure of the resist film to the art copy through said red filter and through the appropriate color corrector film is carried out with an amount of light energy ranging from about 750 to 1250 times the amount conventionally used for exposure of such film in the absence of a red filter.

4. The method of claim 1 in which the film is used to make a resist for etching the black cylinder, in which a positive line image film of textural matter is provided, in which the exposure of the resist film to the art copy is through a blue color corrector film and the line image film, and in which the selective further exposure is through the background burnout film.

5. A multiple exposure method of making resists directly from art copy for etching four-color gravure cylinders, said method comprising:
- providing four-color art copy;
- providing red, green and blue filters;
- providing blue, red and yellow color corrector films;
- making a key negative film from said art copy;
- making a background burnout film from said art copy;
- providing four silver halide gravure resist films;
- making a first photographic exposure of each of three of said gravure resist films to said art copy, one for each of the blue, red and yellow cylinders, each said first exposure of a resist film being made through the appropriate color filter and color corrector film to provide a color corrected latent image of the art copy for one of said cylinders;
- making a second exposure of each of said three resist films through said background burnout film to modify said latent image;
- making a first exposure of the fourth of said gravure resist films to said art copy through the blue color corrector film to provide a latent image of the art copy on said fourth gravure resist film for the black cylinder;
- making a second exposure of said fourth of said resist films through said background burnout film to modify the latent image on said fourth resist film;
- and developing each of said blue, red, yellow and black resist films.

6. The method of claim 5 in which the films bearing the color corrected latent images for each of the blue, red and yellow cylinders are exposed through the key negative film to modify the latent images for undercolor removal before they are exposed through the background burnout film.

7. The method of claim 5 in which the gravure resist film is orthochromatic and is used to make a resist for etching the blue cylinder, the photographic filter is red, and the exposure of the resist film to the art copy through said red filter and through the appropriate color corrector film is carried out with an amount of light energy ranging from about 750 to 1250 times the amount conventionally used for exposure of such film in the absence of a red filter.

(References on following page)

References Cited

UNITED STATES PATENTS

| | | | |
|---|---|---|---|
| 2,060,816 | 11/1936 | McKay | 96—30 |
| 2,114,325 | 4/1938 | Wilkinson | 96—30 |
| 2,165,407 | 7/1939 | Murray | 96—30 |
| 2,177,195 | 10/1939 | Wilkinson | 96—30 |
| 2,339,481 | 1/1944 | Huttkay | 96—44 |
| 2,692,825 | 10/1954 | Sportelli | 96—30 |
| 2,971,841 | 2/1961 | Moore | 96—30 |

OTHER REFERENCES

Mertle, J. S., et al., Photomechanics and Printing, 1957, Mertle Pub. Co., Chicago, pp. 118, 124–127, 131, 138 and 139 only.

DAVID KLEIN, Primary Examiner

U.S. Cl. X.R.

96—44